United States Patent [19]

Prince

[11] 4,195,273
[45] Mar. 25, 1980

[54] CTD CHARGE SUBTRACTION TRANSVERSAL FILTER

[75] Inventor: Paul R. Prince, Fountain Valley, Calif.

[73] Assignee: Hughes Aircraft Company, Culver City, Calif.

[21] Appl. No.: 737,114

[22] Filed: Oct. 29, 1976

[51] Int. Cl.² .............. H03H 7/28; G11C 19/28; G11C 27/02; H01L 29/78
[52] U.S. Cl. .............. 333/165; 307/221 D; 333/166; 357/24
[58] Field of Search .............. 333/70 T, 165, 166; 307/221 C, 221 D, 304; 357/24; 328/167; 364/825-827, 862

[56] References Cited

U.S. PATENT DOCUMENTS

| | | | |
|---|---|---|---|
| 3,809,923 | 5/1974 | Esser | 307/221 D |
| 3,814,955 | 6/1974 | Itoh et al. | 307/221 D X |
| 3,819,958 | 6/1974 | Gosney | 307/221 D X |
| 3,953,745 | 4/1976 | Bailey | 307/304 X |
| 3,999,152 | 12/1976 | Sato et al. | 307/221 D X |
| 4,005,377 | 1/1977 | Engeler | 333/70 T |
| 4,099,197 | 7/1978 | Ibrahim et al. | 307/221 D X |
| 4,123,733 | 10/1978 | Poirer | 333/70 T |

OTHER PUBLICATIONS

Sangster–"The Bucket Brigade Delay Line, a Shift Register for Analogue Signals" in Philips Technical Review, vol. 31, 1970, No. 4, pp. 97-110.
Ibrahim et al.–"CCD'S for Transversal Filter Applications," IEEE, IEDM, Washington, D.C., Dec. 1974, pp. 240-243 and cover page.
Collins et al–"Analog Matched Filters Using Charge Coupled Devices", IEEE NEREM 72 record, Boston, Mass., Oct. 30-Nov. 3, 1972, pp. 155-157, cover page.
Smith et al.–"Active Bandpass Filtering with Bucket-Brigade Delay Lines," IEEE Journal of Solid State Circuits, vol. SC-7, No. 5, Oct. 1972, pp. 421-425.
MacLennan–"Charge Coupled Devices" in Wireless World, Feb. 1975, pp. 61-65.

*Primary Examiner*—Alfred E. Smith
*Assistant Examiner*—Marvin Nussbaum
*Attorney, Agent, or Firm*—W. J. Adam; W. H. MacAllister

[57] ABSTRACT

A CTD (charge transfer device) transversal filter that utilizes displacement current charge substraction techniques to create positive displacement current charge summation for some electrodes and negative displacement current charge summation for other electrodes into and out of a common electrode node. The operation is accomplished by shifting by one half bit all signal charges within the negative tap structure with respect to the signal charges within the positive tap structure. Thus, only a single summing capacitance node is utilized with all taps, plus and minus, being connected together, eliminating the differential amplifier requirement of other CTD transversal filters. An arrangement of either zero tap weights with an extra one bit delay or a separate high-frequency pulse eliminating a one bit delay are utilized to provide or not provide, as desired, zero weighting between the tap sections. The arrangements of the invention provide substantially any desired class of impulse response function and in most arrangements, clock pick-up noise is substantially cancelled and capacitive imbalance between positive and negative sections, being common, is eliminated. The invention applies to both analog and digital tap weight designs.

9 Claims, 22 Drawing Figures

Positive Section

Fig.11a.

Negative Section

Fig.11b.

+ to − Separated by One Bit Delay Equivalent to a Zero Tap Weight. Two Sections Only. $\phi+-=\phi_2$

Fig.12a.

− to + Not Separated by a Delay Thus no Inherent Zero Weight Tap. Two Sections Only. This Is Accomplished by Interchanging $\phi_1$ and $\phi_2$ With $\phi-+=\phi_1$ or Input Polarity May be Reversed.

Fig.12b.

+ to − Separated by Delay and − to + Given a Zero Tap Weight (Last − Electrode or Next + Electrode). Three or More Sections.

Fig.12c.

No Zero Weight in Impulse Response Function and Three or More Sections Requires $\phi 1/2$ of Fig.5.

CTD CHARGE SUBTRACTION TRANSVERSAL FILTER

BACKGROUND OF THE INVENTION

1. Field of the Invention

This invention relates to transversal filters and particularly to an improved transversal filter utilizing charge transfer device techniques and providing subtraction with a substantially high common mode rejection.

2. Description of the Prior Art

CTD transversal filters, either one sided or two sided, have been developed such as the single-sided CCD (charge coupled device) transversal filter of U.S. patent application Ser. No. 960,903 filed Nov. 15, 1978 by Paul R. Prince and assigned to the assignee of the present application. CTDs include bucket brigade devices and CCDs. In the one-sided transversal filter utilizing single phase operation, for example, signal charge packets are all located under the $\phi_1$ storage electrodes when $\phi_1$ is low (P-channel device). At $t_2$ time, a signal $\phi_{SET}$ clamps positive tap nodes to the voltage $\phi_{REF+}$ and all the negative tap nodes to $\phi_{REF-}$. The $\phi_{SET}$ signal is released while $\phi_1$ is down so that as $\phi_1$ rises the displacement currents in each group, that is the positive and negative groups of electrodes, are separately summed on their respective nodal capacitances. The resulting positive signals on the two output leads are caused by each charge packet entering under its downstream floating electrode. As the resulting displacement current flows into the nodal capacitance, the signals $\Delta V_+$ and $\Delta V_-$ on the two output leads must then be accurately differenced using a differential or instrumentation amplifier. Utilizing differential amplifiers has been found to present problems of common mode rejection, linearity, noise, bandwidth, power, size, and relative gain. An arrangement to form a transversal filter that eliminates the need for differencing the output signals while eliminating relative gain errors would represent a substantial advance to the art.

SUMMARY OF THE INVENTION

The concepts of this invention eliminate the need of a differential or difference amplifier at the output of devices requiring both positively and negatively weighted signal summations, such as CTD transversal filters. The arrangements, in accordance with the invention, utilize displacement current charge subtraction techniques with special electrode structures and clocking methods to create positive displacement current charge summation for some electrodes and negative displacement current charge summation for other electrodes into and out of a common electrode node. These polarity differences are provided by delaying by one half bit all signal charges in the second polarity such as the negative tap structure of the transversal filter with respect to the signal charges within the other polarity or positive tap structure and connecting all sensing electrodes together. Thus, only one summing capacitance node is required so that all taps positive and negative are connected together, eliminating the differential amplifier requirement. A unique arrangement is also provided to allow either zero tap weighting or non-zero tap weighting between the filter sections of opposite polarity. Depending upon the configuration of the transversal filter impulse response function being mechanized the use of a single nodal capacitance allows either substantially all or all of the clock pick up signal to be cancelled.

It is therefore an object of this invention to provide a CTD transversal filter that eliminates the need of a differential or difference amplifier.

It is another object of this invention to provide an improved transversal filter system that will develop substantially any transversal filter impulse response function with a high degree of common mode rejection.

It is another object of this invention to provide a CTD transversal filter system that performs the entire filtering function within the CTD structure and applies the filtered signal having a predetermined function to a common output lead.

It is another object of this invention to provide a charge transfer device transversed filter not requiring relative gain compensation.

It is a still further object of this invention to develop a CTD type transversal filter system having a high degree of common mode rejection, high bandwidth and linearity with a minimum of noise and power dissipation.

BRIEF DESCRIPTION OF THE DRAWINGS

These and other objects, features and advantages of the invention as well as the invention itself will become more apparent to those skilled in the art in the light of the following detailed description taken in consideration with the accompanying drawings wherein like reference numerals indicate like or corresponding parts throughout the several views wherein.

DETAILED DESCRIPTION OF THE INVENTION

Figure 1:
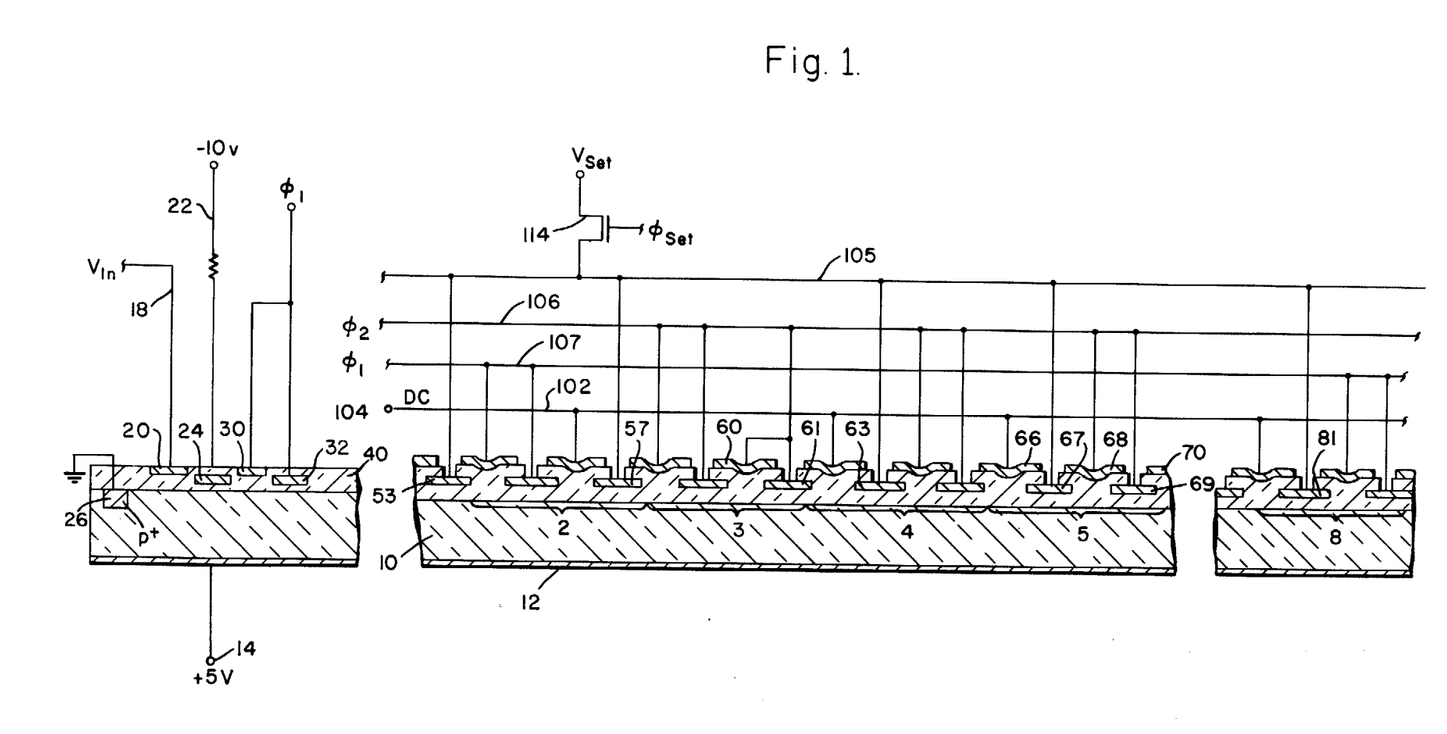
FIG. 1 is a schematic sectional view of a CCD transversal filter in accordance with the invention showing the arrangement of the input and the electrode structures.
Figure 2:
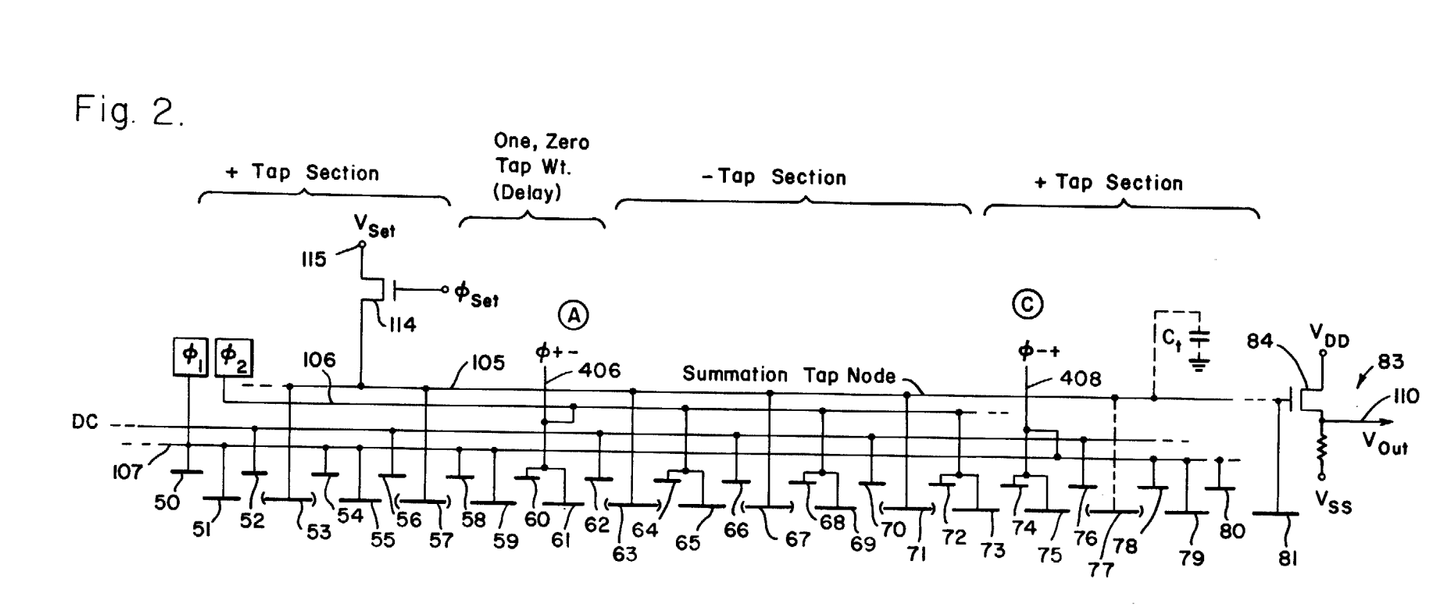
FIGS. 2 and 2a respectively, show a schematic side view of the electrodes and the transfer of the charge packets of the system of FIG. 1 in an arrangement in accordance with the invention with a one-half bit advance of the signal charges in the negative tap section with respect to the signal charges in the positive tap sections with zero tap weights between the sections.
Figure 4:
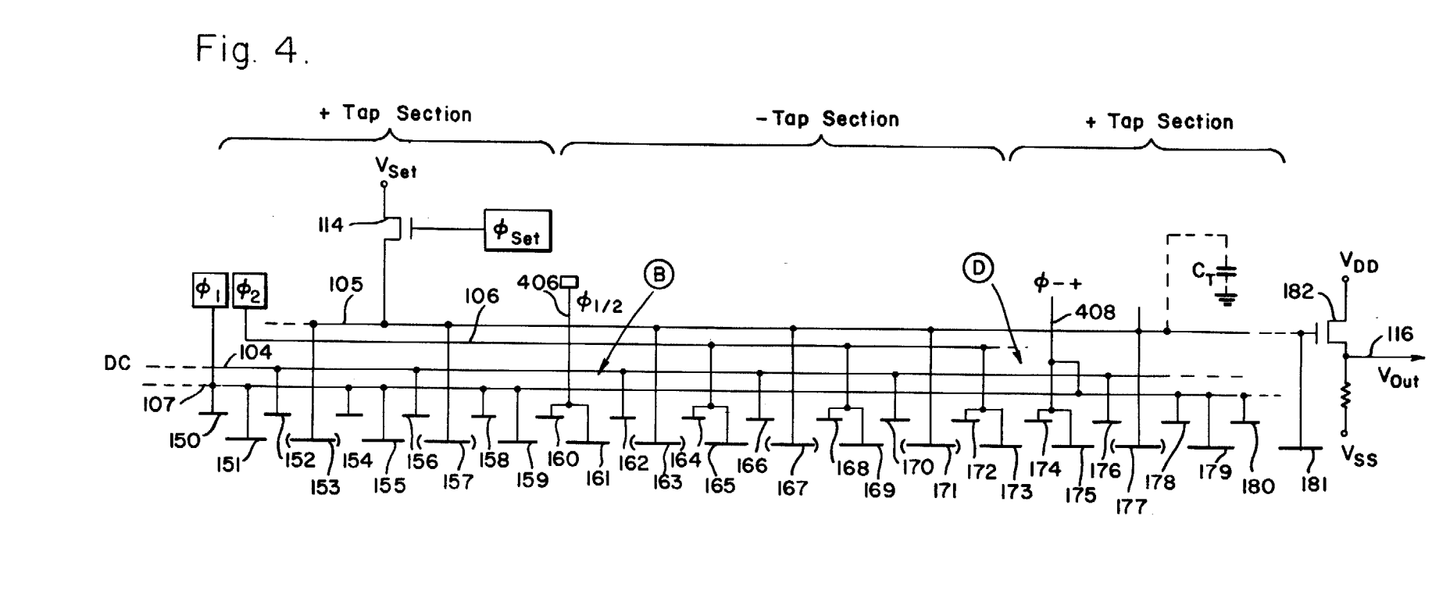
FIGS. 4 and 4a are respectively schematic side views of the electrode structure and the transfer of the charge packets for the transversal filter of FIG. 1 in an arrangement having a one-half bit advance of the signal charges in the negative tap section with respect to the charges in the positive tap sections without zero tap weights between the sections.

Referring first to FIG. 1, the CCD charge subtraction transversal filter in accordance with the invention may be formed on an N type substrate 10 having a bottom conductor plate 12 coupled to a suitable +5 voltage source 14 to form a P channel CCD. An illustrated input structure that may be utilized in accordance with the invention is shown with the signal $V_{IN}$ being applied on a lead 18 to an electrode 20 and with a $-10$ volt bias source applied on a lead 22 to an electrode 24. A P+ input diffusion region 26 is biased to ground in the illustrated arrangement and the +5 volt terminal 14 establishes a reverse bias to the diffusion. The input sampling occurs at electrodes 30 and 32 in response to a $\phi_1$ clock pulse. Electrodes 20 and 30 are surface electrodes and the electrodes 24 and 32 are buried electrodes within an oxide material 40. Each of the electrodes 20 and 24, 30 and 32 are continuous electrodes across the width of the substrate 10 between N+ type channel stops at the edge thereof. Each of the electrodes utilized to explain the invention are sequentially numbered from 50 to 81 and may be seen in FIG. 2. The sectional view of FIG. 1 shows the electrode structure in substantial detail as an illustrative structural example and the structural configuration applies to both FIGS. 2 and 4 as well as generally to FIG. 15. Floating electrodes such as 67 for bit No. 5 may be split electrodes which have an N+ diffusion region 100 (see FIG. 7) at the split position buried in the substrate 10 to divide the charge according to the length of the split electrode and thereby define the magnitude of that value of the impulse response function. Adjacent and preceding the buried split electrode 67 is a surface electrode 66 coupled through a lead 102 to a DC source 104. Electrode 67 is followed by surface and buried electrodes 68 and 69 respectively, both coupled to a $\phi_2$ lead 106. The floating electrode 67 is coupled to a summation node 105 which is coupled to a source follower circuit as shown in FIGS. 2 and 4 and to a $V_{SET}$ source through a reset switch 114. Other floating electrodes shown in FIG. 1 are electrodes 53, 57, 63, and 81. All clocked electrodes such as 30 and 32 (FIG. 1) and 50, 51, 60, 64 and 65 (FIG. 2) are effective to transfer charges and are sometimes hereinafter referred to as charge transfer electrodes.

Figure 6:
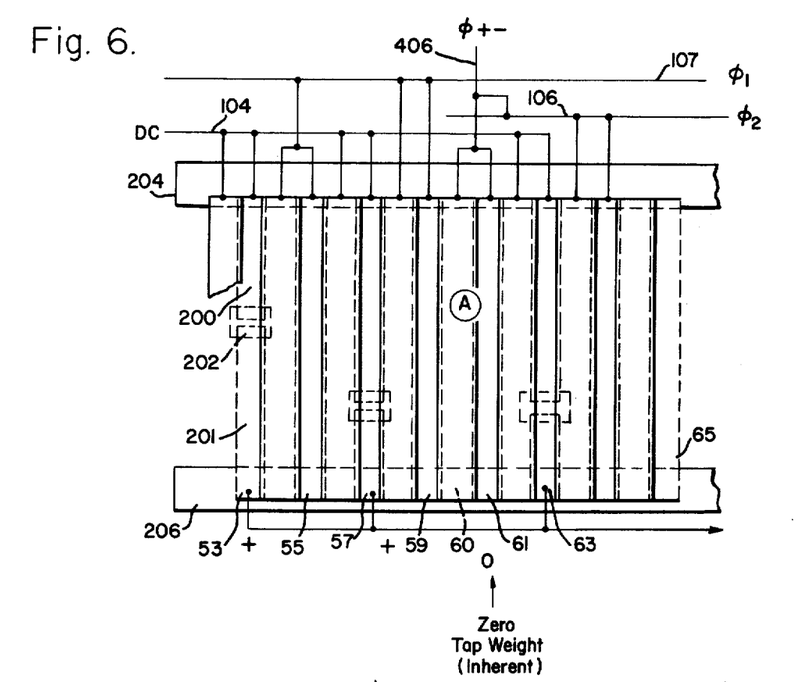
FIG. 6 is a schematic plan view showing the arrangement of a portion of the split and continuous electrodes utilized in the transversal filter of FIG. 2.
Figure 7:
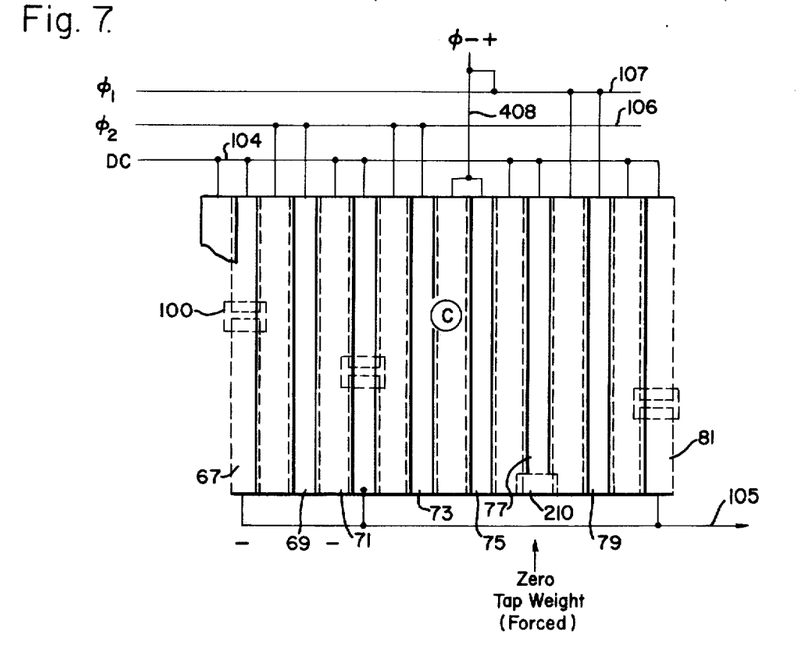
FIG. 7 is a schematic plan view showing further detail of the transversal filter of FIG. 2.

Referring temporarily to FIGS. 6 and 7, a first or arrangement A crossover condition in the polarity of the impulse response function is illustrated in FIG. 6 with a zero tap weight caused by an inherent delay and a second or arrangement C crossover condition with a generated or forced zero tap weight is illustrated in FIG. 7 following the change from a minus to plus portion of the impulse response function utilizing the illustrated polarity of the driving pulses. Surface electrode 60 and buried electrode 61 are $\phi_{30-}$ electrodes providing a delay to accomplish the one-half bit shift feature of the invention and incidently causing an inherent single 0 weighted bit since all signal charges spend one clock period in this region without being sensed. For the zero crossover case from positive to negative, electrodes 60 and 61 are coupled to a $\phi_2$ lead 106 as shown and to provide a non-zero crossover case between positive and negative, the electrodes 60 and 61 are coupled to a special $\phi_1$ signal to advance the charge beyond the inherent zero weight, as will be explained subsequently. For the crossover between negative and positive sections, with the illustrated input driving polarities, a forced zero tap weight 210 or the absence of a forced zero tap weight respectively provide a zero or non-zero crossover.

Figure 2A:
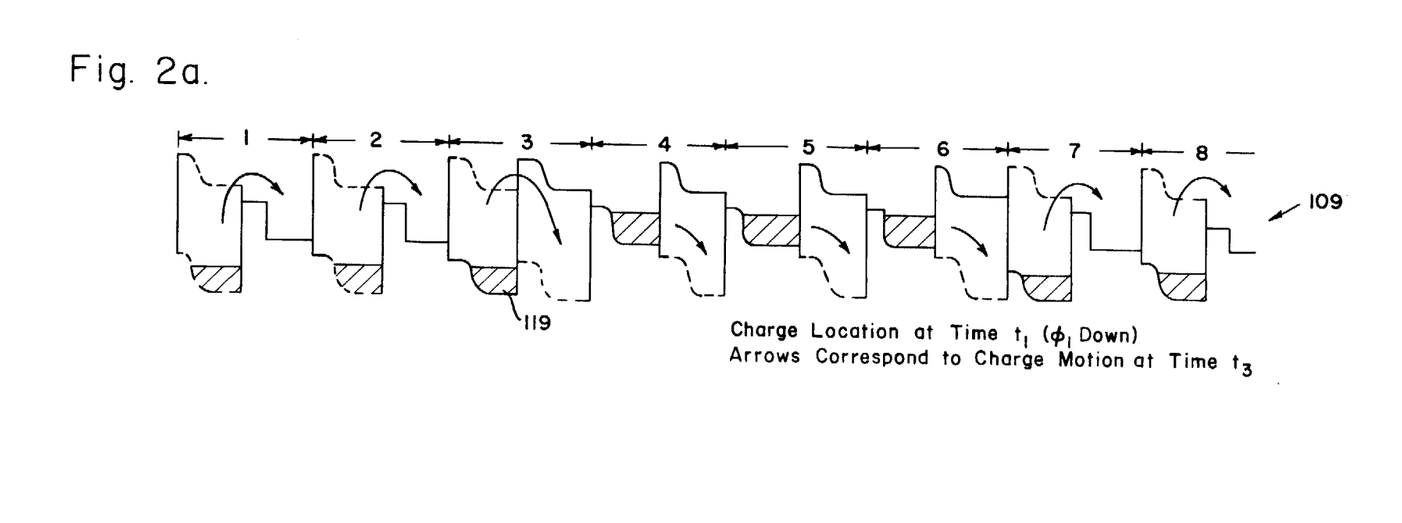
Figure 3:
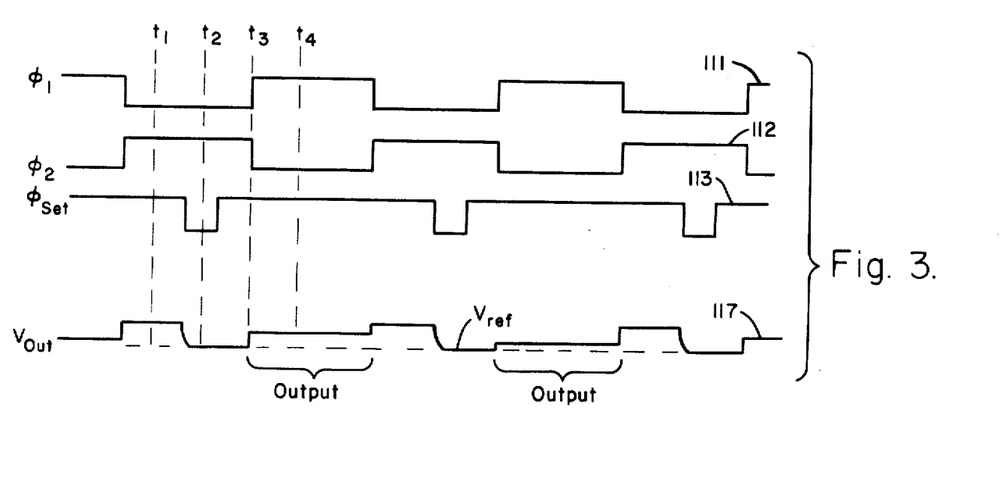
FIG. 3 is a schematic diagram of waveforms of voltage as a function of time for further explaining the arrangement of FIG. 2.
Figure 15:
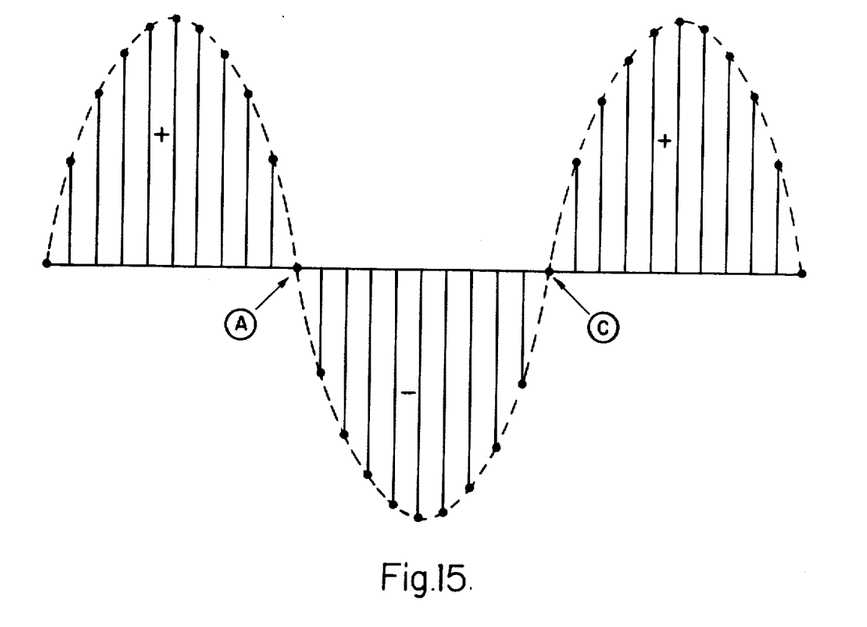
FIGS. 15 and 16 are schematic waveforms showing the filter impulse response functions formed by the arrangement of FIGS. 2 and 4.

Referring now to FIGS. 2, 2a and 3, an arrangement in accordance with the invention having positive, negative, and positive tap sections with zero crossovers in the impulse response function as shown in FIG. 15 will be explained. Electrodes 50 to 81 are shown with the floating electrodes coupled to the lead 105 which in turn is coupled to a source follower circuit 83 that may include a FET 84 coupled between respective negative and positive potential sources $V_{DD}$ and $V_{SS}$ to provide the voltage $V_{OUT}$. At a time $t_1$ the charge location is shown in its position in the line of surface potential profiles 109 and it can be seen that for the plus tap sections the charge is under buried electrodes 51, 55, 59, 75 and 79, while in the negative tap section the charges are under the floating electrodes 63, 67 and 71. At time $t_1$ the negative driving pulse $\phi_1$ of the waveform 111 has been applied to the electrodes such as 50, 51 and 54, 55 in the first positive tap section to cause the charge to move thereunder. Charges also have been moved underneath the floating electrodes 63, 67 and 71 of the negative tap section by the action of the waveform 112 on electrodes such as 64, 65 and 68, 69 in the negative tap section. At a time $t_2$, a $\phi_{SET}$ pulse of a waveform 113 is applied to a set switch 114 and a $V_{SET}$ voltage from a source 115 is applied to the lead 105 and to the floating electrode including electrodes 53, 57, 63, 67, 71, 77 and 81 to establish the surface potential and to establish a reference potential on the lead 105 with current flowing either in or out of the nodal capacitance $C_T$ depending on whether its voltage was positive or negative with respect to $V_{SET}$ at $t_1$. The capacitance $C_T$ functions to store the sum of the displacement current charges from the wells under all of the floating electrodes at time $t_3$ to provide a difference voltage. At time $t_3$ the $\phi_1$ pulse rises and the $\phi_2$ pulse of the waveform 112 falls to its negative potential and the transfer of charges occurs as shown by arrows of the voltage profile 109. At the time $t_3$ the charges in the positive tap sections are transferred underneath the floating electrodes such as 53, 57, 77 and 81 of the positive tap sections and are transferred out from under the floating electrodes such as 63 and 67 in the negative tap sections to cause displacement current flowing from the charges into (for the positive tap sections) or out of (for the negative tap sections) the capacitance $C_T$ and thereby provide a difference voltage $Q/C_T$ on the lead 105. The voltage on lead 105, $V_{OUT}$, is the voltage $V_{SET}$ plus the filter voltage. The source follower 83 coupled to the lead 105 allows that lead to float, and the output voltage of the filter voltage $V'_{OUT}$ is then applied to an output lead 116. Assuming unity gain, $V'_{OUT}$, is substantially shifted only in value from $V_{OUT}$ by the offset voltage of source follower 83. At a time such as $t_4$, the voltage of a waveform 117 may be sensed by suitable output circuitry not shown. Thus it can be seen that the charges in the plus tap sections and the minus sections are subtracted from each other at time $t_3$ or shortly thereafter as a result of the shifted-phase operation of the waveforms 111 and 112. The positive and negative cross-over position which is indicated as an arrangement A for a zero weight crossover from an inherent delay is controlled by electrodes 60 and 61 which provide an additional delay of the charge packet 119 so that at time $t_3$ that charge packet is neither entering under nor transferring from under a floating electrode, and zero crossover weighting is provided. Because in the illustrated arrangement the $\phi_{SET}$ pulses occur during the $\phi_1$ pulses, the crossover between negative and positive requires a zero weight tap electrode 77 with the electrodes 74 and 75 coupled to the $\phi_1$ line 107 to provide an arrangement C crossover condition for a zero value point on the impulse response function. The electrodes 76 and 78 providing a zero tap weight may be coupled to the DC lead 104. This arrangement C and the $\phi_{-+}$ leads will be explained in further detail subsequently. The operation continues in a similar manner with the output information shown by the waveform 117 being continually repeated as the difference voltage provided by the combined displacement current charges in the positive and negative tap sections.

Figure 4A:
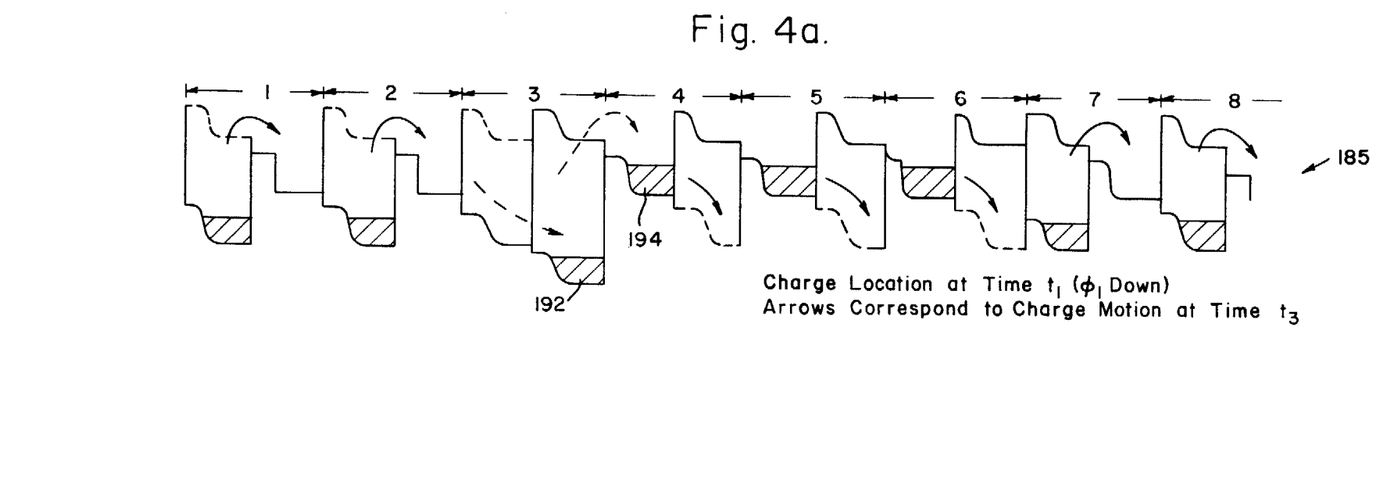
Figure 5:
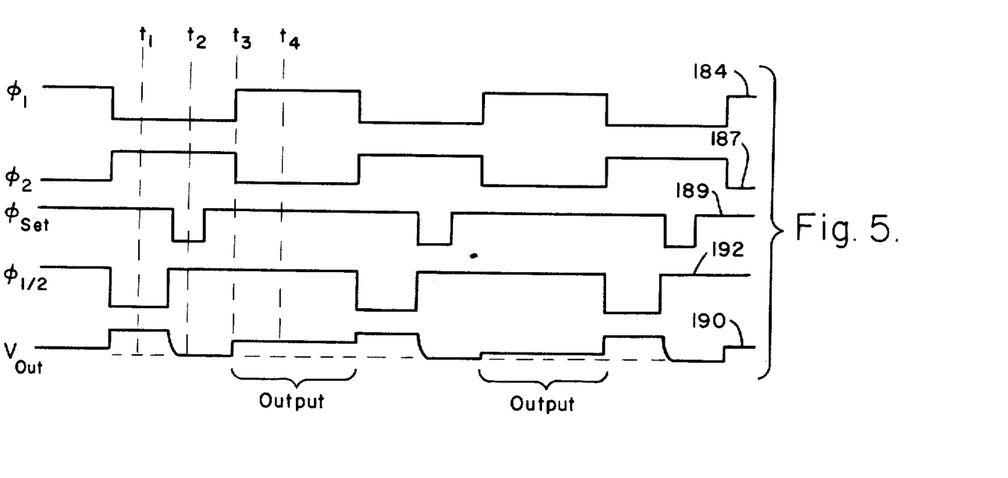
FIG. 5 is a schematic diagram of waveforms showing voltage as a function of time for further explaining the arrangement of FIG. 4.

Reference will now be made to FIGS. 4, 4a and 5 which illustrate positive, negative and positive tap sections with non-zero crossovers between sections and having electrodes 150 to 181. Similar to FIG. 2, the charge location of a voltage profile 185 is shown at time $t_1$ with $\phi_1$ of a waveform 184 down or at the low level. At a time $t_2$ a $\phi_{SET}$ pulse is applied to the lead 105 and in the positive and the negative sections, the electrodes, such as 153, 167 and 181, respond to define the surface potentials and to establish a reference potential for the output voltage. At time $t_3$ the charges move as shown by the arrows of the voltage profile 185 and, as shown by the solid arrows, in the positive sections the charge packets move under the floating electrodes and in the negative sections charges move out from under the floating electrodes. In the positive and negative sections at time $t_3$, current respectively flows into and out of the nodal capacitance $C_T$ to form a difference voltage. The nodal capacitance $C_T$ provides a voltage $Q/C_T$ from resultant charge difference of current packets of opposite polarity moving into or out of the sense wells. At a time such as $t_4$ the output voltage $V_{OUT}$ is available on the lead 105 and is applied to the output dlead 116 through source follwer 182 for being sensed as $V'_{OUT}$ by suitable output circuitry not shown. The output voltage is shown by the voltage $V'_{OUT}$ of a waveform 190 which is shifted from $V_{OUT}$ by the offset voltage of the source follower 182.

For the non zero crossover structural arrangement of FIG. 4, a $\phi_1$ pulse of a waveform 192 which is for an arrangement B is applied to the electrodes 160 and 161 from a suitable source prior to the $\phi_{SET}$ pulse, to move a charge 192 from under the electrode 161 to under the electrode 163 so as to overcome the inherent delay at the positive to negative crossover. Thus, prior to the negative $\phi_2$ pulse and prior to the $\phi_{SET}$ pulse, the charge 192 is moved, while all other charges remain fixed, to the position shown of a charge 194, which is the same charge, so that this charge at the crossover point does contribute a voltage to the capacitance $C_T$ at the clock transition time, and a non-zero crossover weighing may be provided as determined by the split electrode length of electrode 194. For the $\phi_{-+}$ arrangement which is arrangement D, electrodes 174 and 175 are coupled to $\phi_1$ of the lead 107 which is a weighted electrode so that the charge is under floating electrode 177 at time $t_3$ to effectively provide a non-zero or weighted value at crossover.

Referring now to FIG. 6, the arrangement A of FIG. 2 for plus to minus transfer for the zero crossover case caused by an inherent delay will be further explained. The $\phi_{+-}$ lead 406 is coupled to the $\phi_2$ lead 106 so that the charges shortly before, at, or after time $t_3$ are not under a floating or sensing electrode. Thus the electrodes 53, 57, 61 and 63 respectively, provide a +, +, 0, and − current to the output nodal capacitance.

Each of the split or weighted electrodes, such as 53, has two sections with first end 200 coupled to the DC lead 104 and a second end 201 (whose length defines the relative weighting coefficient for the impulse response functions) coupled to the output lead 105. In order to split the charge passing along the channel an N+ diffusion region such as 202 is provided beneath each gap and, although not illustrated with pointed ends, may be pointed at the input end and the output end along the channel. Also provided at the edges of the channel are N+ stop regions 204 and 206 to maintain the charge passing along the channel as is well known in the art.

Referring now to FIG. 7 which is arrangement C for the zero crossover case of FIG. 2, the $\phi_{-+}$ lead is coupled to the $\phi_1$ lead 107 to provide a one half bit delay and is followed by a zero weighting at the zero weighted electrode 77. The electrode 77 which provides a forced zero tap weight is coupled to the DC lead 104 at the top end. The other end of the electrode 77 is not coupled to the output lead 105 but includes an N+ diffusion region 210 to balance out the similar N+ diffusion regions of the other split electrodes such as 67. Thus, by not coupling the electrode 77 to the lead 105 a forced zero tap weight is provided for a zero crossover from the negative to positive sections of the structure. Electrodes 67, 71, 77 and 81 thus respectively provide a signal −, −, 0, + to the output nodal capacitance on the lead 105.

Figure 8:
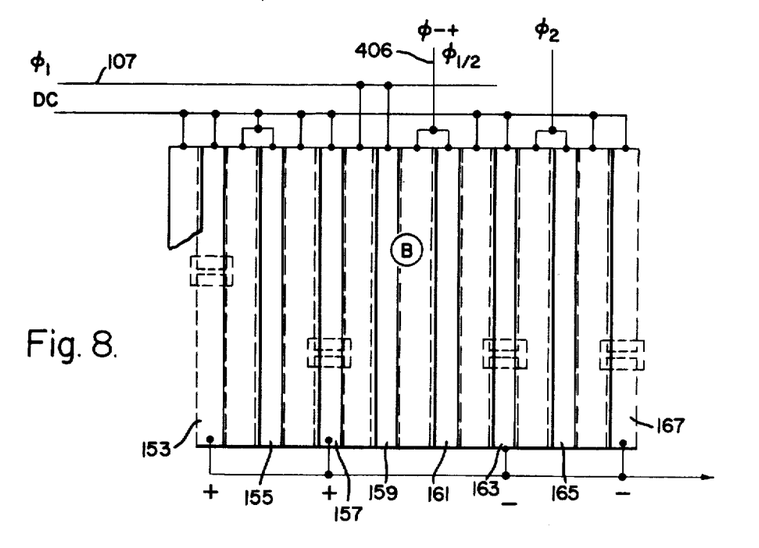
FIG. 8 is a schematic plan view showing a portion of the transversal filter of FIG. 4 including the split and floating electrodes and the special control electrodes.

Referring now to FIG. 8, the non-zero crossover arrangement B of FIG. 4 will be further explained. The $\phi_{+-}$ lead 406 is coupled to the $\phi_1$ pulse and the electrodes 160 and 161 act to move the charge to a sensing position prior to time $t_3$ as previously explained. For this negative to positive transition during the next full phase the charge is under the electrode 163 which is the floating electrode and provides a weighted output.

Figure 9:
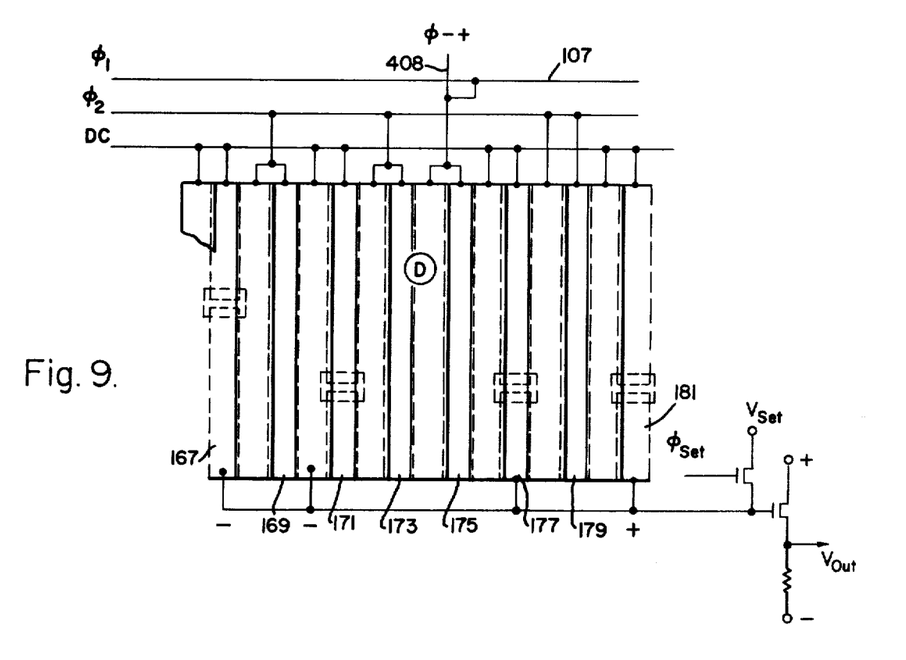
FIG. 9 is a schematic plan view showing a portion of the transversal filter of FIG. 4 including the split and floating electrodes and the special control electrodes.

Referring now to FIG. 9, the arrangement D for the non-zero crossover function of FIG. 4 has the $\phi_{-+}$ lead 408 coupled to the $\phi_1$ lead 107 so that the charge packet at time $t_4$ is under the weighted electrode 177, which is coupled to the lead 105. N+ diffusion stops are provided in the substrate such as under electrode 177 so that the charges divide and are maintained split when being transferred under the floating electrodes. Thus, for the arrangement D, the normal weighted electrode structure provides the non-zero crossover condition to the filter impulse response function.

Figure 10:
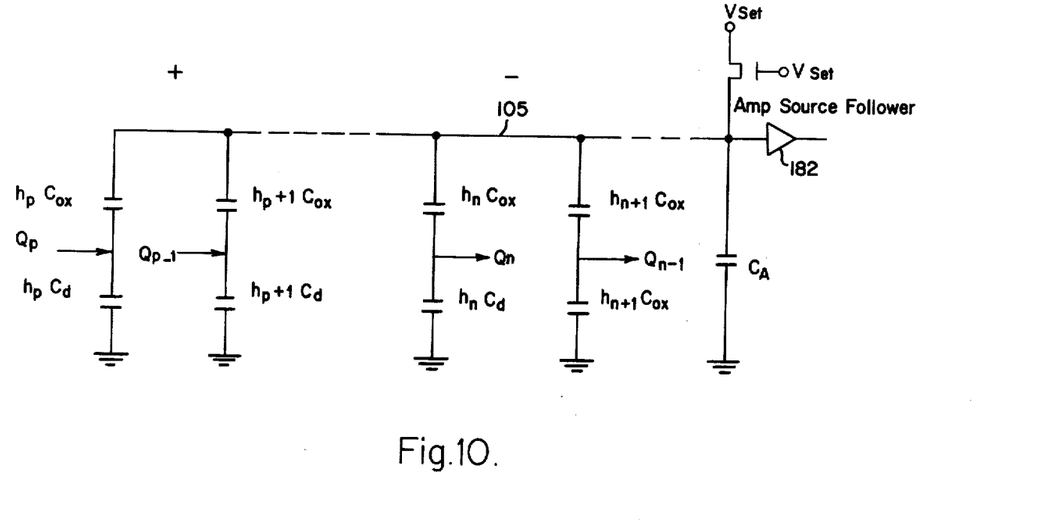
FIG. 10 is an equivalent circuit diagram of the capacitances in the CCD structure for further explaining the operation and performance of the invention.
Figure 11A:
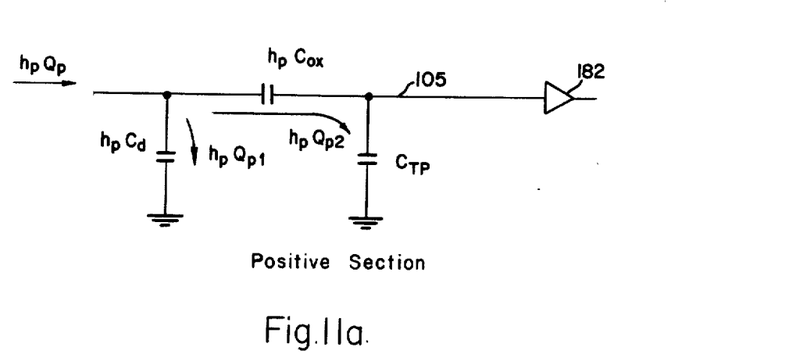
FIGS. 11a and 11b are equivalent circuit diagrams for respective positive and negative sections of the capacitance existing at a single bit position relative to the total capacitance for either polarity section.
Figure 11B:
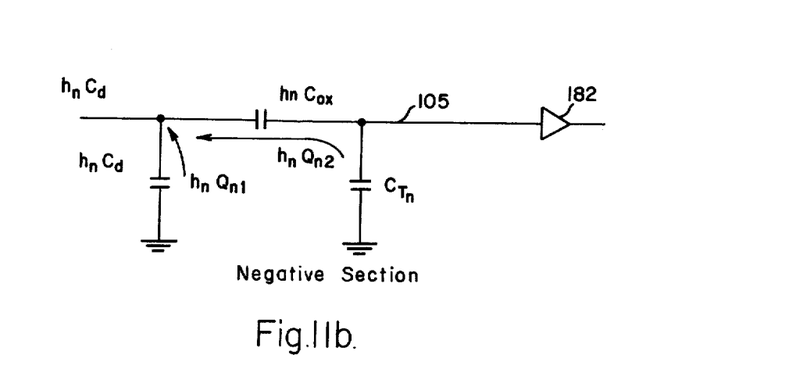

Referring now to FIGS. 10 and 11, the current flow at the illustrated time $t_3$ to provide the differencing action will be further explained. FIG. 10 shows the equivalent capacitance for two bit positions of each of a positive and a negative section for explanatory purposes. FIGS. 11a and 11b, respectively, show the equivalent capacitive diagrams for one positive bit position of each of the positive and negative sections of FIG. 10. The following definitions apply to the symbols in FIGS. 10, 11a and 11b:

subscript p is the first shown weighted positive electrode,
subscript n is the first shown weighted negative electrode,
$Q_p$ = signal charge entering under the $p^{th}$ electrode at time $t_3$,
$Q_n$ = signal charge transferring out from under the $n^{th}$ electrode at time $t_3$. $Q_n$ corresponds to an earlier sample of the signal and $Q_p$ to a later sample,
$C_A$ = amplifier input capacitance and all stray capacitance,
$h_p$ and $h_n$ = weighting factors $0 \leq h_i \leq 1.0$
$C_{ox}$ = oxide capacitance for a full length electrode (h = 1.0)
$C_d$ = depletion capacitance for a full length electrode (value is a function of surface potjential but for simplification, hereinafter the voltage dependency is neglected).
$\Delta V_{p,t3}$ = an incremental voltage (positive) caused by $Q_p$ entering under electrode p at $t_3$
$\Delta V_{n,t3}$ = an incremental voltage (negative) caused by $Q_n$ leaving from under electrode n at $t_3$
M = total number of sense electrodes including any inherent and any forced zero tap weight electrodes.

The total sense node capacitance is $C_t$.

$$C_t = C_A + \frac{C_{ox} C_d}{C_{ox} + C_d} \left( \sum_{\substack{i \text{ over} \\ \text{all } M}} h_i \right)$$

and $$\Delta V_{p,t3} = \frac{+Q_{p2}}{C_{tp}} = \frac{+Q_p h_p}{C_{tp}} \left[ \frac{\left( \frac{h_p C_{ox} C_{tp}}{h_p C_{ox} + C_{tp}} \right)}{h_p C_d + \left( \frac{h_p C_{ox} C_{tp}}{h_p C_{ox} + C_{tp}} \right)} \right]$$

$$\simeq \frac{Q_p}{C_t} h_p \text{ for } C_t \gg h_p C_{ox} \gg h_p C_d$$

such as for a transversal filter with more than about 25 tap weights
while $$\Delta V_{n,t3} = \frac{-Q_{n2}}{C_{tn}} = \frac{-Q_n h_n}{C_{tn}} \left[ \frac{\frac{h_n C_{ox} C_{tn}}{h_n C_{ox} + C_{tn}}}{h_n C_d + \left( \frac{h_n C_{ox} C_{tn}}{h_n C_{ox} + C_{tn}} \right)} \right]$$

$$\simeq \frac{-Q_n}{C_{tn}} h_n$$

for
$C_{tn} \gg h_n C_{ox} \gg h_n C_d$ where:

$$C_{tp} = C_A + \frac{C_{ox} C_d}{C_{ox} + C_d} \left( \sum_{\substack{i \text{ over all } M \\ \text{except } p}} h_i \right)$$

and $$C_{tn} = C_A + \frac{C_{ox} C_d}{C_{ox} + C_d} \left( \sum_{\substack{i \text{ over all } M \\ \text{except } n}} h_i \right)$$

In the positive and negative sections of FIG. 10, at the time $t_3$ displacement current flows respectively into and out of the couplings between the capacitors $C_{ox}$ and $C_d$. The resulting charge, Q, is divided into $Q_1$ and $Q_2$ according to capacitive division. The positive section of FIG. 11a shows the paths of current $Q_p$ at time $t_3$ into the equivalent capacitors and the negative section of FIG. 11b shows the paths of the current out of the equivalent capacitors for $Q_n$. It is to be noted that FIGS. 11a and 11b each represent a single floating electrode position. By super-position, the total voltage summation at time $t_3$ is $$\Delta V_{t3} = \sum_{\substack{i \text{ over} \\ \text{all } M}} \Delta V_{i,t3} \quad \text{for } i \text{ assuming all values of } p \text{ and } n,$$

and since $C_{tn} \simeq C_{tp} \simeq C_t$, $$\Delta V_{t3} \simeq \frac{1}{C_t} \sum_{\substack{i \text{ over} \\ \text{all } M}} Q_i h_i, \text{ but}$$

$$C_t \simeq C_d \sum_{\substack{i \text{ over} \\ \text{all } M}} h_i \text{ for } C_{ox} \gg C_d \text{ and small } C_A$$

so that:

$$C_t \simeq C_d KM$$

where:
M = total number of split electrodes and
K = the total area ratio of the sense portions of the split electrodes to the total for a one-sided transversal filter (i.e., K = average $h_i$)

thus:

$$\Delta V_{t3} \simeq \frac{1}{KMC_d} \sum_{\substack{i \text{ over} \\ \text{all } M}} Q_i h_i$$

for both positive and negative weighting coefficients without the requirement for a differential amplifier. The effective gain factor 1/K (typically 3 or more) appearing above and not appearing in the output of typical CCD transversal filters arises from the use of the one-sided transversal filter concept of Ser. No. 597,731 in conjunction with this invention. This additional gain factor provides increase of signal without increasing the noise (and actually decreasing some components of the noise) so that the signal/noise ratio is substantially increased.

Figure 12A:
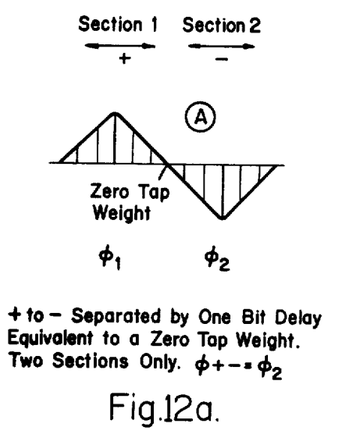
FIGS. 12a to 12d are schematic diagrams of the filter impulse response functions formed by the structures or portions of the structures of FIGS. 2 and 4.
Figure 12B:
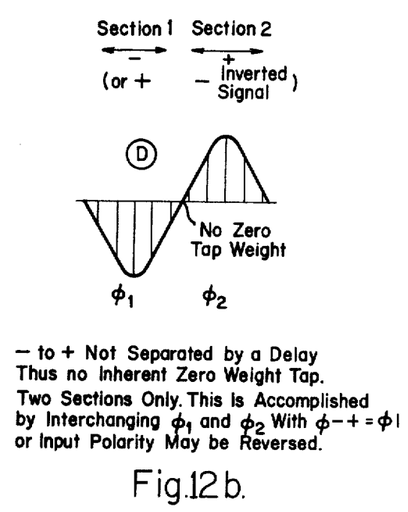
Figure 12C:
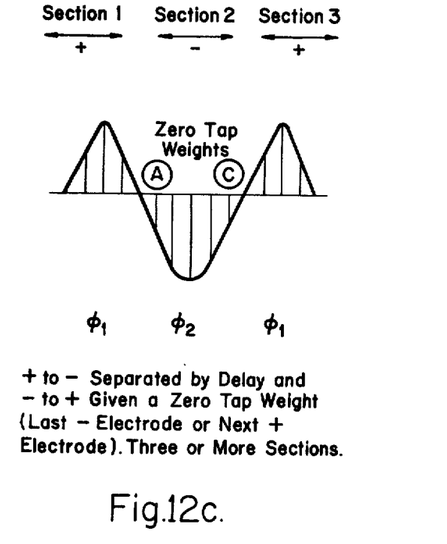
Figure 12D:
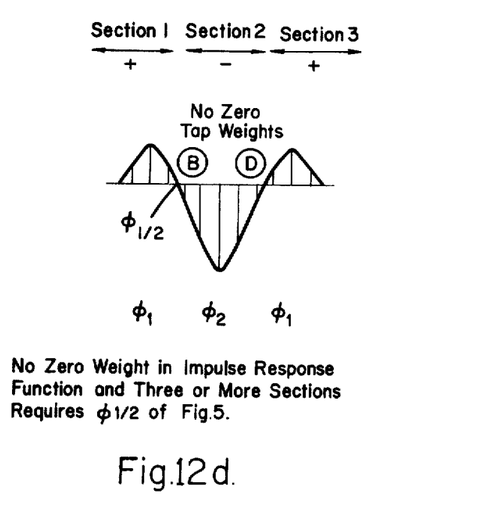

Referring now to FIGS. 12a to 12d, some of the variations that may be utilized in accordance with the principle of the invention will be further explained. FIG. 12a shows an impulse response function with a zero tap weight required between positive and negative sections and it can be implemented by an inherent 1 bit delay which is equivalent to a zero tap weight of type A of FIG. 2. FIG. 12b shows a non-zero tap weight impulse response requirement with negative to positive (C), or positive to negative sections not separated by a delay. The change from negative to positive sections to positive to negative sections may be accomplished by interchanging $\phi_1$ and $\phi_2$ and coupling $\phi_{-+}$ to $\phi_1$. Reversal of the input polarity may be provided. FIG. 12c shows three sections $+ - +$ with zero tap weights or zero crossovers with the positive to negative sections separated by a delay and the negative to positive sections given a zero tap weight at the first positive electrode after the negative section. The arrangement of FIG. 12c results from the arrangement shown in FIG. 2. FIG. 12d shows three sections, $+$, $-$ and $+$, with non-zero tap weights requiring $\phi_{42}$ to be utilized for the positive to negative crossover as provided by the arrangement of FIG. 4.

Referring to the weighting diagram of FIG. 15, which further illustrates the zero crossover condition of FIG. 2, the arrangement C of FIG. 12c utilizes all the structure of FIG. 2. For providing the impulse response function of FIG. 12a only the first two sections of the structure of FIG. 2 are utilized, leaving off the arrangement C.

Figure 16:
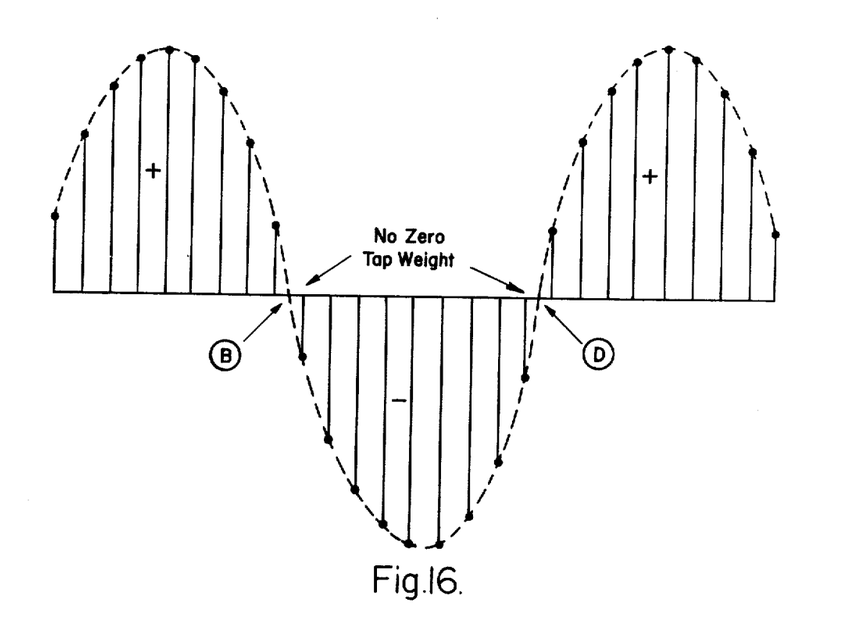

Referring now to the weighting diagram FIG. 16, which is an arrangement further illustrating the structure of FIG. 4, the arrangement of FIG. 12d utilizes all the structure of FIG. 4. For the arrangement of FIG. 12b, the last two sections are utilized without the arrangement B. It is to be noted that by providing one common node and one source follower, the effective interconnect and input capacitance is minimized so that reset noise is minimized and signal is maximized so that signal-noise ratio is increased.

Figure 13:
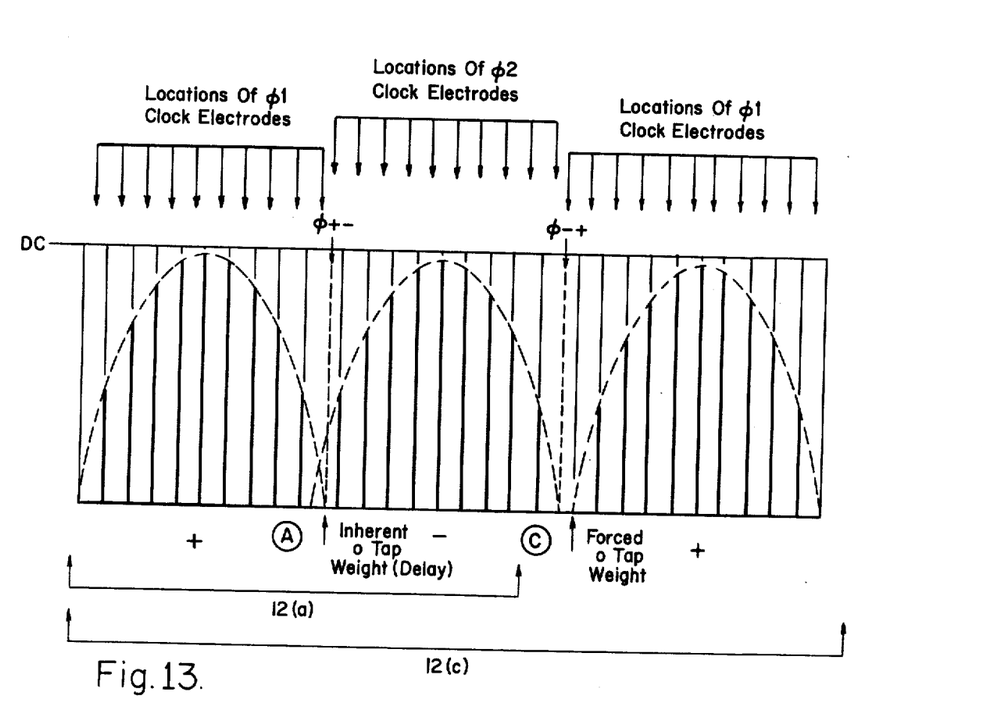
FIG. 13 is a schematic diagram of the tap weighting of the arrangement of FIG. 2.
Figure 14:
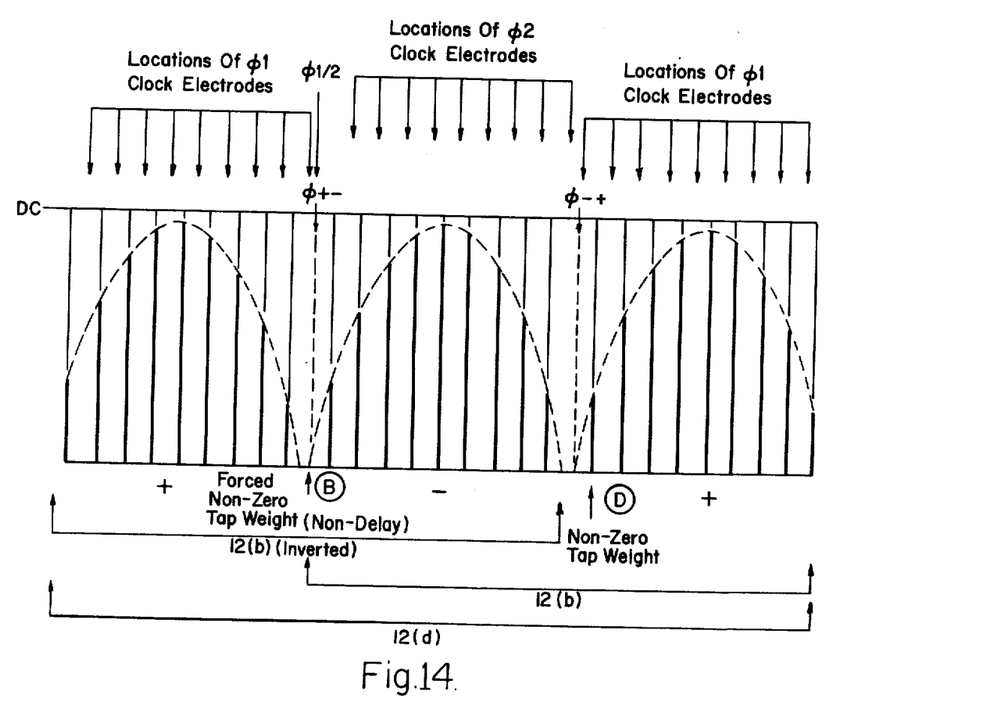
FIG. 14 is a schematic diagram of the tap weighting of the arrangement of FIG. 4.

Referring now to FIGS. 13 and 14, FIG. 13 shows an impulse response function developed by a structure of the class shown in FIG. 2 and FIG. 14 shows an impulse response developed by a structure of the class shown in FIG. 4.

Thus, there has been provided a transversal filter arrangement that utilizes charge subtraction by clamping the floating electrodes when some of the charges are underneath. By combining and properly phasing the positive and negative sections of any impulse response function the nodal capacitance which includes the capacitance of the amplifier, the capacitance of the oxide and the diffusion capacitance stores a first value provided by a polarity such as the negative polarity sections to be subtracted from the opposite polarity signals such as the positive polarity sections. The concept in accordance with the invention is also applicable to variations such as a dual function charge-coupled device charge subtraction transversal filter. The principles of the invention have been illustrated with a CCD structure but it is to be understood that they are equally applicable to other suitable structures such as bucket brigade devices.

What is claimed is:

1. A charge transfer transversal filter adapted for responding to input signal charges, comprising:
   a substrate;
   at least one first section and at least one second opposite polarity section disposed on said substrate, each of said sections having at least one group of electrodes along said substrate with each group providing a time delay and including charge transfer electrodes and a sensing electrode, said first and second section having a crossover area along said substrate between opposite polarity sections;
   a set of electrodes disposed across said crossover area for providing a fraction or more of said time delay to the signal charges;
   a source of first phase clock pulses coupled to selected charge transfer electrodes of said first section;
   a source of second phase clock pulses coupled to selected charge transfer electrodes of said second section;
   means for coupling together selected ones of said sensing electrodes of said first and second sections;
   reset means, coupled to at least said selected ones of said sensing electrodes for periodically applying a reset voltage thereto; and wherein
   the relative location of said electrodes and the relative timing of said first and second phase clock pulses are such that as charges are transferred under the sensing electrodes of said at least one first section, charges are transferred out from under the sensing electrodes of said at least one second section.

2. A CTD transfersal filter responsive to a source of charge signals comprising:
   a substrate,
   a selected number of first and second polarity sections disposed on said substrate,
   a plurality of groups of electrodes in each of said sections, with each group including charge directing and transferring electrodes and a sensing electrode with each group providing a time delay;
   a set of electrodes provided across crossover areas along said substrate between said first and second polarity sections to provide for a time delay of said charge signals which is different from the time delay of said charge signals provided by said first or second sections;
   a summation node coupled to selected ones of said sensing electrodes,
   a source of reset pulses coupled to said selected ones of said sensing electrodes,
   a source of first phase clock pulses coupled to said charge directing and transferring electrodes in said first polarity sections,
   a source of second phase clock pulses coupled to said charge directing and transferring electrodes in said second polarity sections, and wherein
   the relative location of said electrodes on said substrate and the relative timing of said first and second phase clock pulses are such that as charges are transferred under the sensing electrodes of said first polarity sections charges are transferred out from under the sensing electrodes of said second polarity sections.

3. A charge transfer transversal filter adapted for responding to input signal charges, comprising:
   a substrate;
   at least one first section and at least one second opposite polarity section disposed on said substrate, each of said sections having at least one group of electrodes along said substrate with each group providing a time delay of one clock period and including charge transfer electrodes and a sensing electrode;

a set of charge transfer electrodes at a crossover area along said substrate between opposite polarity sections;

a source of first phase clock pulses coupled to selected charge transfer electrodes of said first section;

a source of second phase clock pulses coupled to selected charge transfer electrodes of said second section;

a source of second phase clock pulses coupled to selected charge transfer electrodes of said second section;

means for coupling together selected ones of said sensing electrodes of said first and second sections;

reset means, coupled to at least said selected ones of said sensing electrodes for periodically applying a reset voltage thereto;

a source of third phase clock pulses coupled to said set of charge transfer electrodes and timed relative to said first and second phase clock pulses so as to advance the signal charges through said crossover area with less than said one clock period of time delay; and wherein the relative location of said electrodes and the relative timing of said first and second phase clock pulses are such that as charges are transferred under the sensing electrodes of said at least one first section, charges are transferred out from under the sensing electrodes of said at least one second section.

4. A CTD transversal filter responsive to a source of charge signals, comprising:

a substrate, a selected number of first and second polarity sections disposed on said substrate, a plurality of groups of electrodes in each of said sections, with each group including charge directing and transferring electrodes and a sensing electrode, some of said sensing electrodes being split and stop diffusions are disposed in said substrate under said splits so as to provide analog weighting, a summation node coupled to selected ones of said sensing electrodes, a source of reset pulses coupled to said selected ones of said sensing electrodes, a source of first phase clock pulses coupled to said charge directing and transferring electrodes in said first polarity sections, a source of second phase clock pulses coupled to said charge directing and transferring electrodes in said second polarity sections, and wherein the relative location of said electrodes on said substrate and the relative timing of said first and second phase clock pulses are such that as charges are transferred under the sensing electrodes of said first polarity sections charges are transferred out from under the sensing electrodes of said second polarity sections.

5. The combination of claim 4 in which said source of reset pulses includes means to develop said reset pulses during the occurrence of predetermined first phase or second phase clock pulses.

6. The combination of claim 4 in which said summation node includes capacitance which stores the voltage values of said charges and wherein subtraction of voltages representative of said charges between said first and second polarity sections occurs.

7. The combination of claim 4 in which sets of electrodes are provided across crossover areas along said substrate between said opposite polarity sections to provide for a time delay of said charge signals which is different from the time delay of said charge signals provided by said first or second sections.

8. A charge transfer transversal filter adapted for responding to input signal charges, comprising:

a substrate;

at least one first section and at least one second opposite polarity section disposed on said substrate, each of said sections having at least one group of electrodes along said substrate with each group providing a time delay and including charge transfer electrodes and a sensing electrode, some of said sensing electrodes being split and stop diffusions being disposed in said substrate under said splits so as to provide analog weighting, a crossover area along said substrate between opposite polarity sections and a set of electrodes disposed across said crossover area for providing a fraction or more of said time delay to the signal charges;

a source of first phase clock pulses coupled to selected charge transfer electrodes of said first section;

a source of second phase clock pulses coupled to selected charge transfer electrodes of said second section;

means for coupling together selected ones of said sensing electrodes of said first and second sections;

reset means, coupled to at least said selected ones of said sensing electrodes for periodically applying a reset voltage thereto; and wherein the relative location of said electrodes and the relative timing of said first and second phase clock pulses are such that as charges are transferred under the sensing electrodes of said at least one first section charges are transferred out from under the sensing electrodes of said at least one second section.

9. A charge transfer transversal filter adapted for responding to input signal charges, comprising:

a substrate;

at least one first section and at least one second opposite polarity section disposed on said substrate, each of said sections having at least one group of electrodes along said substrate with each group providing a time delay of one clock period and including charge transfer electrodes and a sensing electrode, some of said sensing electrodes being split with stop diffusions being disposed in said substrate under said splits so as to provide analog weighting;

a set of charge transfer electrodes at a crossover area along said substrate between opposite polarity sections;

a source of first phase clock pulses coupled to selected charge transfer electrodes of said first section;

a source of second phase clock pulses coupled to selected charge transfer electrodes of said second section;

a source of third phase clock pulses coupled to said set of charge transfer electrodes and timed relative to said first and second phase clock pulses so as to advance the signal charges through said crossover area with less than said one clock period of time delay;

means for coupling together selected ones of said sensing electrodes of said first and second sections;

reset means, coupled to at least said selected ones of said sensing electrodes for periodically applying a reset voltage thereto; and wherein the relative location of said electrodes and the relative timing of said first and second phase clock pulses are such that as charges are transferred under the sensing electrodes of said at least one first section, charges are transferred out from under the sensing electrodes of said at least one second section.

* * * * *